(12) United States Patent
Emerson et al.

(10) Patent No.: US 7,500,858 B2
(45) Date of Patent: Mar. 10, 2009

(54) PORTABLE ELECTRONIC DEVICE WITH BUILT-IN TERMINAL COVER STRUCTURE

(75) Inventors: Brandon Emerson, Boise, ID (US); Rick D'Ambrosio, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/494,432

(22) Filed: Jul. 27, 2006

(65) Prior Publication Data

US 2008/0026614 A1 Jan. 31, 2008

(51) Int. Cl.
*H01R 13/44* (2006.01)

(52) U.S. Cl. .................. 439/136; 439/131; 439/135

(58) Field of Classification Search ............... 439/136, 439/147, 131, 135, 141; 361/679, 684–686, 361/725–727
See application file for complete search history.

(56) References Cited

U.S. PATENT DOCUMENTS

| | | | |
|---|---|---|---|
| 6,671,808 B1 * | 12/2003 | Abbott et al. | .................. 726/4 |
| 6,926,544 B2 | 8/2005 | Lee | |
| 6,932,629 B2 | 8/2005 | Ikenoue | |
| D519,503 S * | 4/2006 | Aqqad et al. | ............... D14/356 |
| 2005/0079738 A1 | 4/2005 | Ahn | |
| 2005/0130469 A1 * | 6/2005 | Ikenoue | ...................... 439/131 |
| 2008/0019090 A1 * | 1/2008 | Zhu et al. | .................... 361/684 |

OTHER PUBLICATIONS

ACP-EP Memory 1GB USB 2.0 Mobile Swing Drive, Copyright © 2005, www. globalgoved.com, 2 pages.
Swissbit 512MB retroAlox Victorinox Flash Drive, Copyright © 2005, www. globalgoved.com, 2 pages.
Leading Driver, LD 256MB USB Flash Memory Pen Drive, 1999-2006 All rights reserved, www.memorysuppliers.stores.yahoo.net, 3 pages.
A-Data 128MB PDO Folding USB2.0 Flash Drive, Copyright © 2005, 111.tigerdirect.com, 2 pages.
Lexar 1GB JumpDrive Sport USB Flash Drive, Copyright 2006, ZipZoomFly.com, 3 pages.
Corsair 4GB Flash Voyager USB 2.0 Drive, Copyright 2006, ZipZoomFly.com, 3 pages.

* cited by examiner

*Primary Examiner*—Renee Luebke
*Assistant Examiner*—Vanessa Girardi
(74) *Attorney, Agent, or Firm*—TraskBritt

(57) ABSTRACT

A portable electronic device including a housing having a receptacle for at least one semiconductor die, a terminal carried by the housing and operably coupled to the at least one semiconductor die, an attached cover, and operation indicators. In one position, the cover encompasses and protects the terminal, and in another, the terminal is exposed for use. The operation indicators are positioned on the device housing so as to be visible to the user regardless of the orientation of the electronic device when installed in the port of a compatible electronic device.

19 Claims, 9 Drawing Sheets

PORTABLE ELECTRONIC DEVICE WITH BUILT-IN TERMINAL COVER STRUCTURE

BACKGROUND OF THE INVENTION

1. Field of the Invention

The present invention relates to a portable electronic device with a terminal, built-in terminal cover structure and additional usability features. More specifically, the present invention relates to a portable data storage device.

2. Discussion of Related Art

There are various portable electronic data storage devices (hereinafter "storage devices") that include a terminal for effecting an external connection with another device. These storage devices are primarily used in conjunction with personal computer systems; however, they may also interface with other host electronic equipment including cameras, game consoles, personal digital assistants (PDAs), etc. The most recent storage devices have the ability to store large volumes of data such as, for example, personal information, work files, photographs and music. The relatively small physical size of these storage devices allows a user to place the device in a purse or pocket, yet have access to stored data anywhere a workstation or other electronic device with a compatible port is available. The mobility of these storage devices does result in some inherent problems, including potential damage to the terminal contacts by loose change, car keys or other objects that the terminal may contact, and accumulation of dirt and lint around, and between, the contacts. Some devices provide a discrete cap for the terminal itself. However, due to its small size, the cap is easily misplaced or separated from the storage device. Other storage devices do include integrated caps attached with rubber straps, hinged or even rotating, as described in U.S. Pat. No. 6,932,629 to Ikenoue. However, such storage devices and associated caps lack certain desirable usability elements. Additionally, these storage devices typically operate silently when connected to host equipment such as a personal computer, as they lack any indicator to the user that the storage device is properly connected and transferring data. Designers have attempted to solve this problem by including one or more indicator lights positioned on the exterior of a storage device. However, the host equipment often locates ports, typically USB ports, to receive the terminal, in a position on the exterior of the host equipment wherein the visibility of the storage device indicator lights is compromised.

BRIEF DESCRIPTION OF THE DRAWINGS

While the specification concludes with claims particularly pointing out and distinctly claiming that which is regarded as the present invention, certain advantages of this invention can be more readily ascertained from the following description of the invention when read in conjunction with the accompanying drawings in which:

DETAILED DESCRIPTION OF THE ILLUSTRATED EMBODIMENTS

Figure 1A:
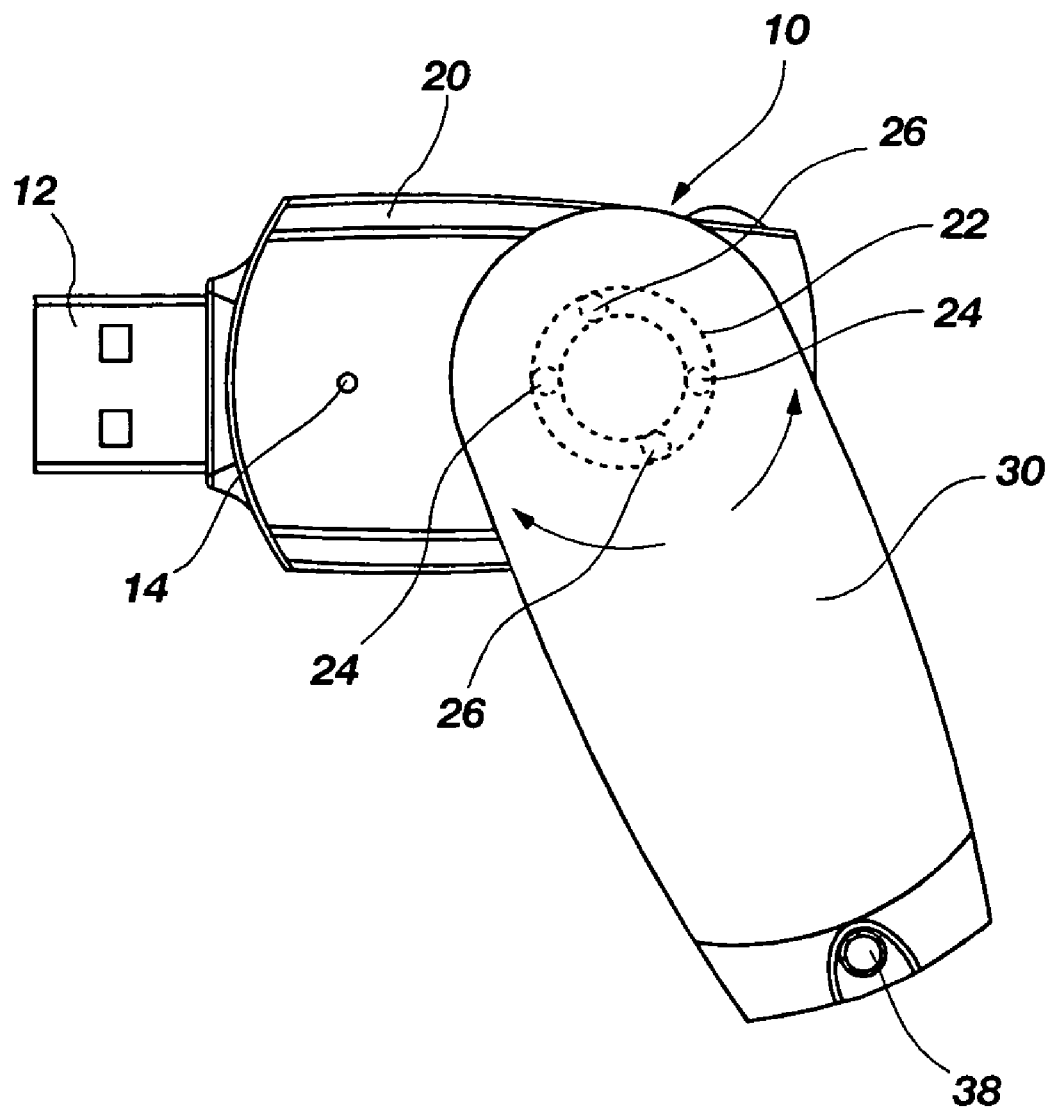
FIGS. 1A-1E depict one embodiment of the invention including a blind articulation and locking element.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

The present invention relates to portable electronic data storage devices that include a terminal, hereinafter termed "storage devices" or "electronic devices" for the sake of convenience and not by way of limitation. The storage devices include structural features and elements configured for protecting the device and the data they store, improving ease of use, and enhancing functional appeal.

One embodiment of the present invention relates to a storage device having a housing from which a terminal protrudes, an attached cover with a blind engagement mechanism and additional usability features. The terminal may be configured, for example, as a USB (universal serial bus) terminal, although the invention is not so limited. The housing includes a receptacle where at least one semiconductor die is installed, the semiconductor die being electrically connected to the terminal, which is designed to engage a compatible port on another electronic device, termed for the sake of convenience, "host equipment." The housing fully encompasses and protects the at least one semiconductor die. The cover, and its manner of engagement with the housing, is designed to protect the terminal when not in use, and to expose the terminal for use in connecting to host equipment by rotation with respect to the housing. Structural engagement between the cover and the housing is "blind"; that is to say, the engagement elements are hidden from the user by the cover. The housing includes female engagement features including at least one circular groove on an exterior surface thereof with at least one depression, or deeper segment, in the bottom of the groove. If only one circular groove is employed, a single pivot depression is formed concentric with the circular groove on the opposite side of the housing exterior. Cooperatively configured and located male engagement features are formed on the inside of the open end of the cover, the engagement structures comprising, for example, protrusions in the form of balls, studs, or posts. At least two of the male engagement features are desirable for cooperative engagement with each circular groove, whereas the pivot depression only requires a single male engagement feature. The device cover and housing are cooperatively structured so that the cover may stop or lock in discrete positions in relationship to the housing. This is accomplished when a male engagement feature of the cover enters a depression in the circular groove, as the user must apply some additional rotational force to move the cover from this position. The cover is constructed of a material that is resiliently flexible enough to be spread apart when fitted over the housing during the assembly stage, and then return to an original shape that allows the male engagement features on the interior thereof to seat in the corresponding female engagement features of the housing. The cover material must also be substantially rigid so the engagement between the cover and the housing remains secure. Exemplary materials for both the housing and the cover are stainless steel, aluminum, anodized aluminum, thermoplastic, plastic, or a polyamide such as vinyl.

In another embodiment of the invention, at least some of the engagement features are visible. These engagement structures may include at least one knob or rounded trunnion on the device housing, which engages a corresponding hole in the cover. A securing or locking structure, including at least one recess in the housing and at least one corresponding engagement structure such as a ball, pin or stud on the inside of the cover, may also be used.

Another embodiment of the invention includes operation indicators such as LEDs that are positioned on major, opposing sides of the device housing. The operation indicators may protrude slightly from the device surface and are positioned on the device housing so at least one indicator is visible to the user when the storage device terminal is inserted in a port of another electronic device, regardless of the port orientation.

Another embodiment of the invention includes a trunnion extending from an exterior surface of the device housing and that has at least one flat side on the shaft thereof. The trunnion will be constrained against rotation in a narrow section of a slot in the cover, when the at least one flat side of the trunnion is parallel to the sides of the slot; however, when the trunnion encounters an enlarged portion of the slot, the cover is free to rotate around the device housing. A closed end of the cover also incorporates a cap including a receptacle sized and configured to receive the terminal end. When the cap is engaged with the terminal end the user can pull the cover and housing apart longitudinally, until the trunnion reaches the enlarged portion of the slot, permitting the cover to be rotated around the device housing. When the cover has been rotated 180° about the housing so that the cap is adjacent with the housing end without the terminal, the narrow section of the slot may again be aligned parallel with the flat side or sides of the trunnion, and the cover and device housing can be longitudinally pushed together to effectively lock the cover in the open position.

Another embodiment of the invention also includes a trunnion that rides in a slot in the cover. In this embodiment, a cap having a receptacle sized and configured to receive the terminal is incorporated in a first end of the cover and an opening through which the terminal may protrude is incorporated in the second end. The cover is in a locked position when the terminal engages either the cap or the opening. However, once the cover and housing have been pulled longitudinally apart, the cover is free to rotate around the housing. The terminal extends through the opening in the second end of the cover when the device is in operating condition, for insertion into a host equipment port.

In another embodiment of the invention, the housing and the cover are configured with a side opening and the cover is rotationally secured to the housing, the cover and housing being mutually engaged with a manually operable release mechanism against rotational bias of a spring element biasing the device towards an open position with the terminal exposed. The user can manually, rotationally push the housing into the cover to protect the terminal and protect where the housing is secured by the release mechanism. The device can again be brought into an operating position by simply pressing a release button of the release mechanism.

In yet another embodiment of the invention, the device housing is disposed in a cover that substantially surrounds the housing and has an opening in one end of the cover sized to permit the device terminal to protrude therethrough. The device housing is longitudinally biased toward the open position with a spring element. The user may secure the housing with the terminal received within the cover by longitudinally pressing the terminal end, until a trigger mechanism engages. To move the terminal back into an operating condition, the user may push a release button of the trigger mechanism.

In yet another embodiment of the invention, the device housing is disposed in a cover that substantially surrounds the housing and has an opening in one end of the cover sized to permit the device terminal to protrude therethrough. The device housing is longitudinally biased toward the open position with a spring element. The housing may be retracted back into the cover to hide the terminal using a thumb slide that protrudes through a slot in the side of the cover. When the terminal is fully retracted, a trigger mechanism engages a recess in the housing exterior, securing the housing in a position with the terminal inside of the cover. The user may push a release button of the trigger mechanism to move the terminal back into an operating condition.

Additionally, for each of the embodiments, protective structures are contemplated including the use of an elastomer, a polyamide or a plastic material in order to form coatings, bumpers or shields on the housing and cover. Ergonomic features including recesses and raised traction aids may also be included, such features aiding the user when manipulating the configuration of the device or when the device is installed or removed from a port on another electronic device. Additionally, a convenient key ring or lanyard hole is formed in the cover allowing a user to securely attach the device to a keyring, lanyard or similar structure to prevent loss of the storage device.

Several considerations regarding size and shape of the electronic storage device 10 are pertinent to each of the following embodiments. The receptacle within the housing for the semiconductor die or dice should be of sufficient size to accommodate at least one memory element in the form of a semiconductor memory die. It is contemplated that a plurality of nonvolatile memory dice, such as flash memory dice, may be disposed within the housing of the device providing, in one nonlimiting example, up to eight gigabytes of memory capacity. The overall width, or thickness, of the electronic storage device 10 should be small enough to enable multiple electronic storage devices 10 to be plugged into conventional, closely adjacent receptacles, such as USB ports, in host equipment, side by side or in a vertically stacked configuration. It is desirable that the overall length of electronic storage device 10 should be substantially the same when the device is both open and closed or, more specifically, the device is desirably not more than 25% greater in length in the open position than in the closed position.

FIGS. 1A-1E depict a first embodiment of the storage device 10, including a housing 20 having a terminal 12 protruding from one end thereof and encompassing one or more semiconductor dice S operably coupled to terminal 12, and a cover 30. The device housing 20 may be configured in various shapes, including the streamlined, somewhat rounded rectangular shape, as shown by way of example. The device cover 30 is of a generally "U" shape when viewed from the side (FIG. 1C), comprising two substantially parallel extensions 30a and 30b connected by an intermediate portion 30c, and is formed from a material exhibiting sufficient spring characteristics and rigidity to allow the major sides of the cover 30 to be flexed laterally outwardly beyond substantially parallel (see FIG. 1 for cover 30 in an unflexed state) to enable the opposing sides of the cover 30 to be mutually spread, extended over and engaged with the device housing 20. Blind mutual engagement structure for the device housing 20 and the cover 30 includes an orbital groove or recess 22 in the exterior of one side of the device housing 20, including at least one deeper lock segment or depression 24 (two shown in FIGS. 1D and 1E). A pivot recess 25 is incorporated into the exterior of an opposing side of device housing 20 from the orbital recess 22 and concentric therewith. At least one lock protrusion 26 (two shown in FIG. 1A) in the form of studs or hemispherical bumps are formed on the interior of one side of cover 30 at 180° opposing locations across a diameter equal to that of orbital recess 22, and pivot protrusion 27 in the form of a stud or hemispherical bump is formed on the interior of the opposing side of cover 30 at a position central to the orbital recess and longitudinally midway between lock protrusions 26. Thus, when cover 30 is placed over housing 20, the receipt of lock protrusions 26 in orbital groove 22 and of pivot protrusion in pivot recess 25 enables the cover 30 to pivot 360° around the device housing 20. Further, when lock protrusions 26 are received in lock segments 24, housing 20 and cover 30 are securely mutually engaged at either a 0° position wherein the terminal 12 is shielded by cover 30 or at an 180° position wherein the cover 30 is in a fully open position, exposing terminal 12, each of these two positions placing housing 20 and cover 30 in a mutually parallel orientation.

Additionally, at least two visually perceptible operation indicators 14 such as, for example, blue LEDs (shown in pairs in FIG. 1B), are disposed on opposing surfaces of the device housing 20 between the major surfaces to allow the user to readily see the operating status of the storage device 10 regardless of the device orientation and whether another device or terminal for another device is plugged into an adjacent host equipment port. Operation indicators 14 are operably coupled into a circuit between semiconductor dice S and host equipment through the terminal 12 when the storage device 10 is plugged into the host equipment to cause operation indicators to flash at a variable rate when the electronic device 10 is in electrical communication with another electronic device, the flash rate varying corresponding to the rate of data transfer between storage device 10 and the host equipment. Device housing 20 also includes ergonomic features including a pair of grip elements 48 disposed on opposite sides of the device housing 20. Similar grip elements may be disposed on the exterior of cover 30, if desired. The ergonomic features enable the user to more securely handle the electronic device 10 when plugging into or unplugging from a port on another electronic device. These ergonomic features are, by way of example, and other like features including a patterned recess, raised ridges or treads, etc., on the exterior of housing 20 and cover 30 may be included. Cover 30 may include a key ring or lanyard hole, shown in the form of a sculpted, recessed orifice 38 to allow a user to securely fasten the electronic device 10 to a key-ring or similar structure.

Figure 1B:
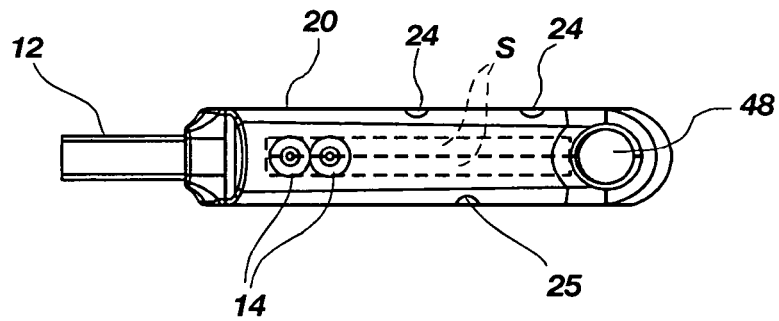
Figure 1C:
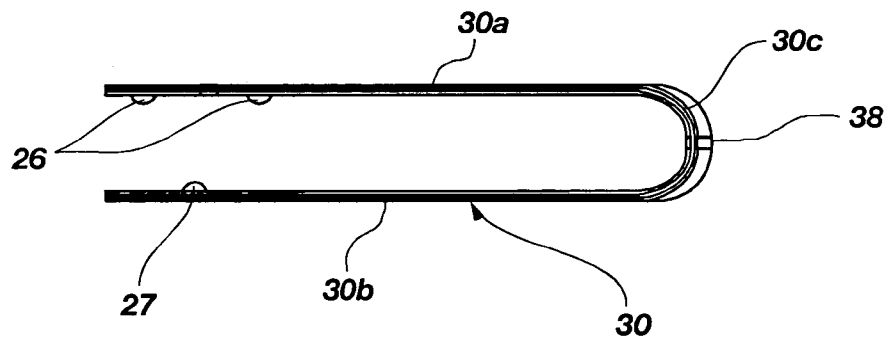
Figure 1D:
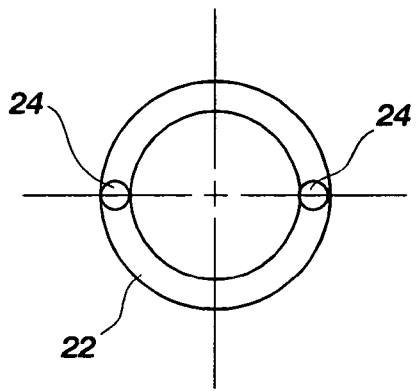
Figure 1E:
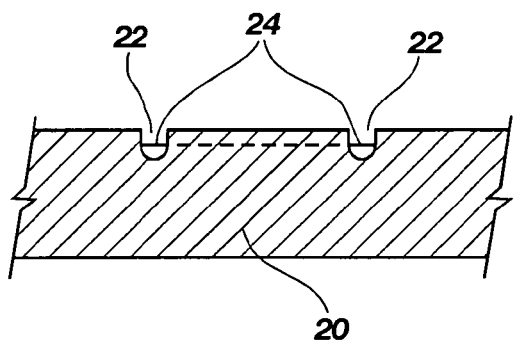
Figure 2A:
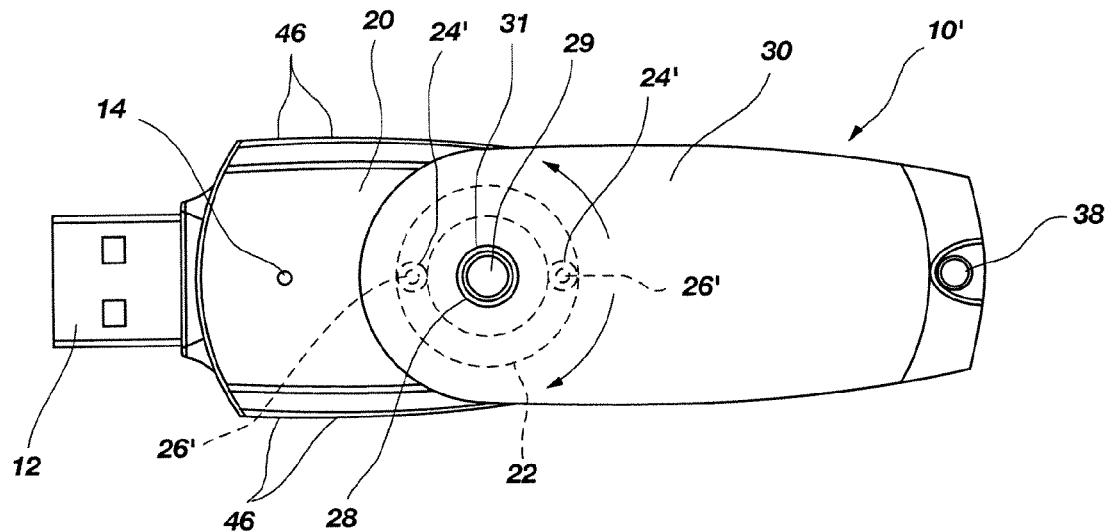
FIGS. 2A-2D depict one embodiment of the invention including a trunnion based articulation element.
Figure 2B:
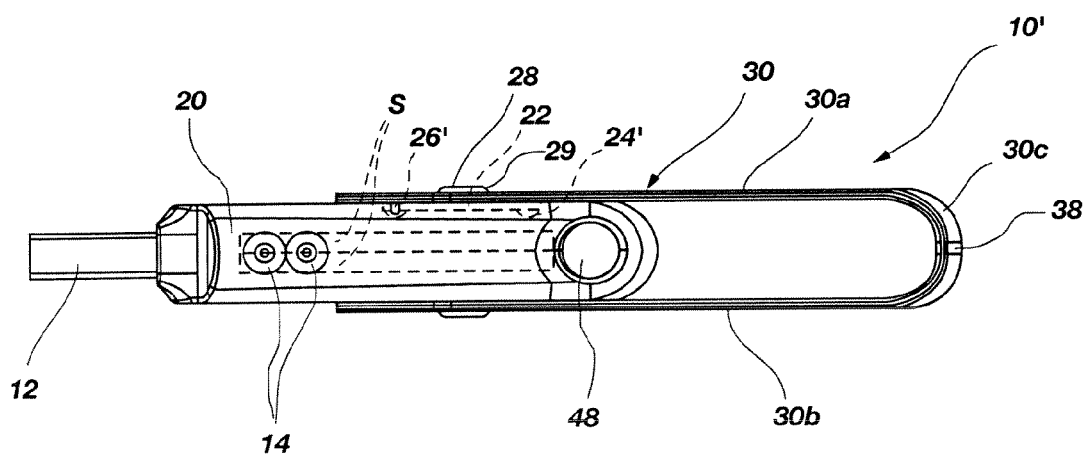
Figure 2C:
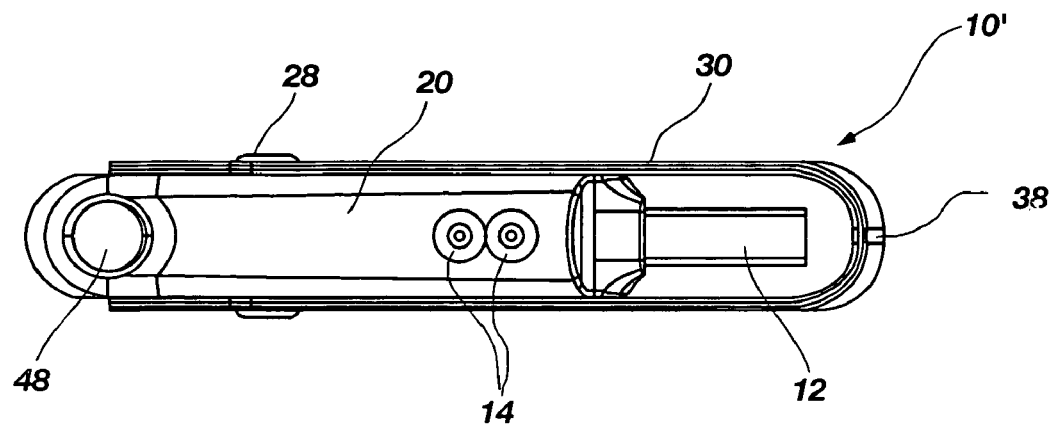
Figure 2D:
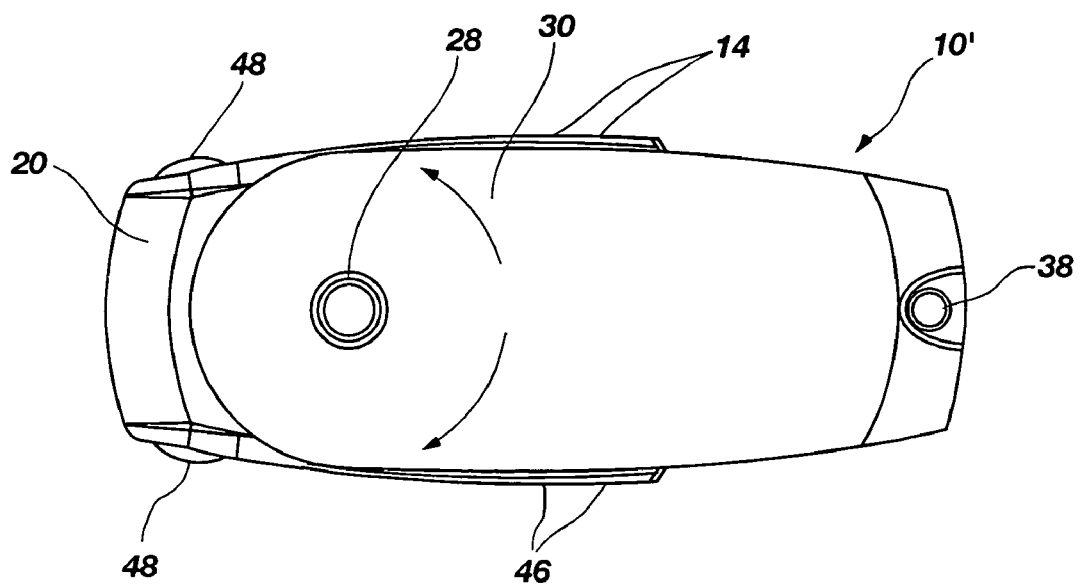

FIGS. 2A-2D show an embodiment of an electronic storage device 10' similar to the device of FIGS. 1A-1C. However, this embodiment includes a single node engagement element 28 comprising nubs or trunnions 29 on opposing sides of housing 20 received in corresponding apertures 31 in cover 30. A rotational locking mechanism similar to the blind engagement structure of FIGS. 1A-1C including a circular groove which may be characterized as an orbital recess 22, one or more recesses, which may be characterized as lock recesses 24', and lock studs 26' may be employed to lock cover 30 in the 0° and 180° positions. Alternatively, lock recesses 24' may be formed in the housing 20 on diametrically opposing sides of at least one nub 29 and at least one correspondingly located lock stud 26' on the inside of the device cover 30 may be included.

Figure 3A:
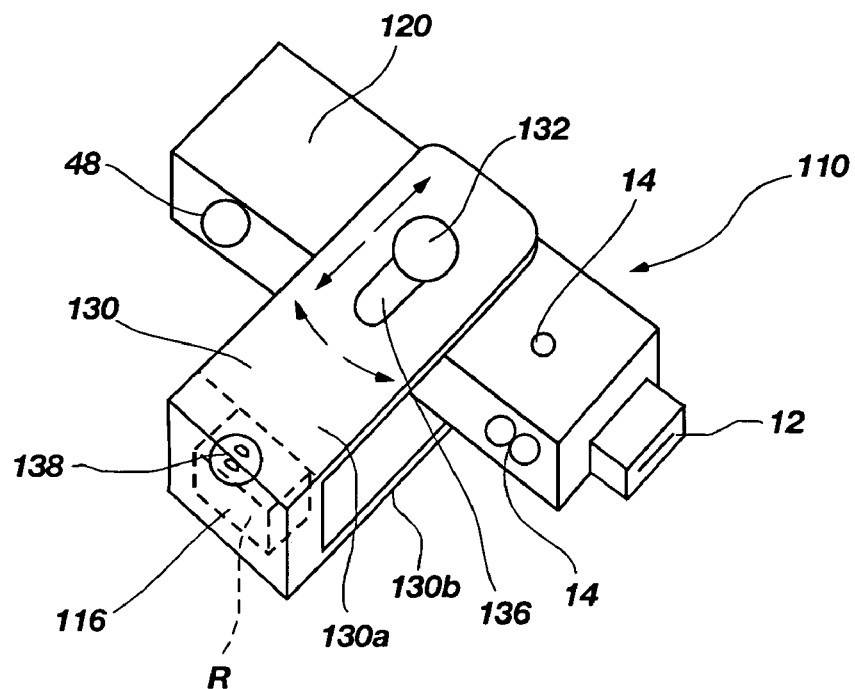
FIGS. 3A and 3B depict one embodiment of the invention including a cap incorporated into the cover.
Figure 3B:
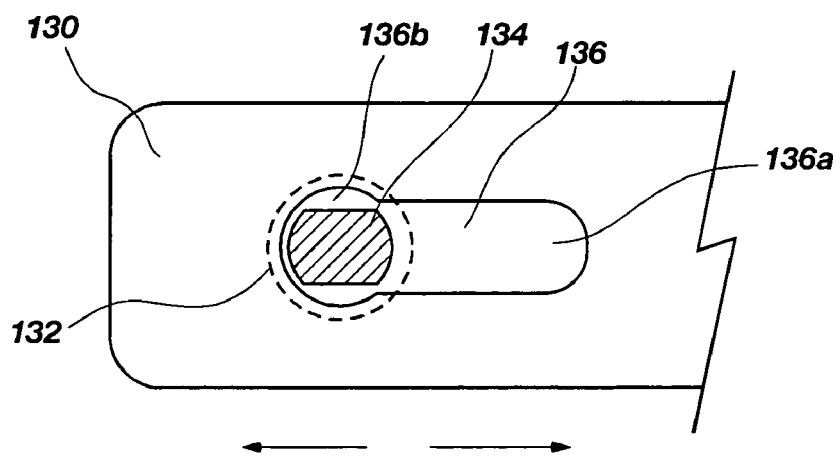

The storage device 110 shown in FIGS. 3A and 3B includes a housing 120 having one or more semiconductor dice (not shown for clarity) disposed therein, and a terminal 12 protruding from one end thereof. A cap 116 is located at one end of cover 130 comprising extensions 130a and 130b, and one or more trunnions protruding from at least one (or opposing) sides of housing 120, each having a trunnion shaft 134 having at least one flat side received in a slot 136 in an extension of cover 130. Slot or slots 136 may each include an elongated, narrow portion 136a and an enlarged, shown as rounded, portion 136b. In a first orientation, at 0°, cover 130 and rotationally aligned device housing 120 can be fully longitudinally telescoped together with the flat side or sides of trunnion shafts 134 slidably received in and longitudinally guided by the elongated, narrow portions 136a of slots 136, aligning the terminal 12 with receptacle R of cap 116 and inserted therewithin. To change the storage device 10 from this orientation, the cover 130 and device housing 120 are longitudinally mutually extended from the inwardly telescoped condition until trunnion shafts 134 are positioned in the enlarged portions 136b of slots 136. In this fully extended condition, cover 130 can now be rotated a full 360° around the device housing 20. When cover 130 has been rotated 180°, the cover 130 and device housing 120 may, again, be telescoped together, locking the storage device 10 in a fully open orientation as trunnion shafts 134 are again received with their flat side or sides within the narrow portions 136a of slots 136. This selective locking is accomplished when the flat side or sides of trunnion shaft 134 are constrained in the narrow section of shaped slot 136. If only one trunnion is employed, a trunnion cap 132 may be provided to keep cover 130 from disengaging from the sole trunnion shaft 134. Additionally at least one operation indicator 14 is positioned on each major side of the device housing 120 as to be clearly visible when cover 130 is locked in the open position and terminal 12 received within a host equipment port. Grip elements 48 may be provided on the exterior of housing 120, on cover 130, or on both, and a key ring or lanyard aperture 138 provided in cover 130.

Figure 4:
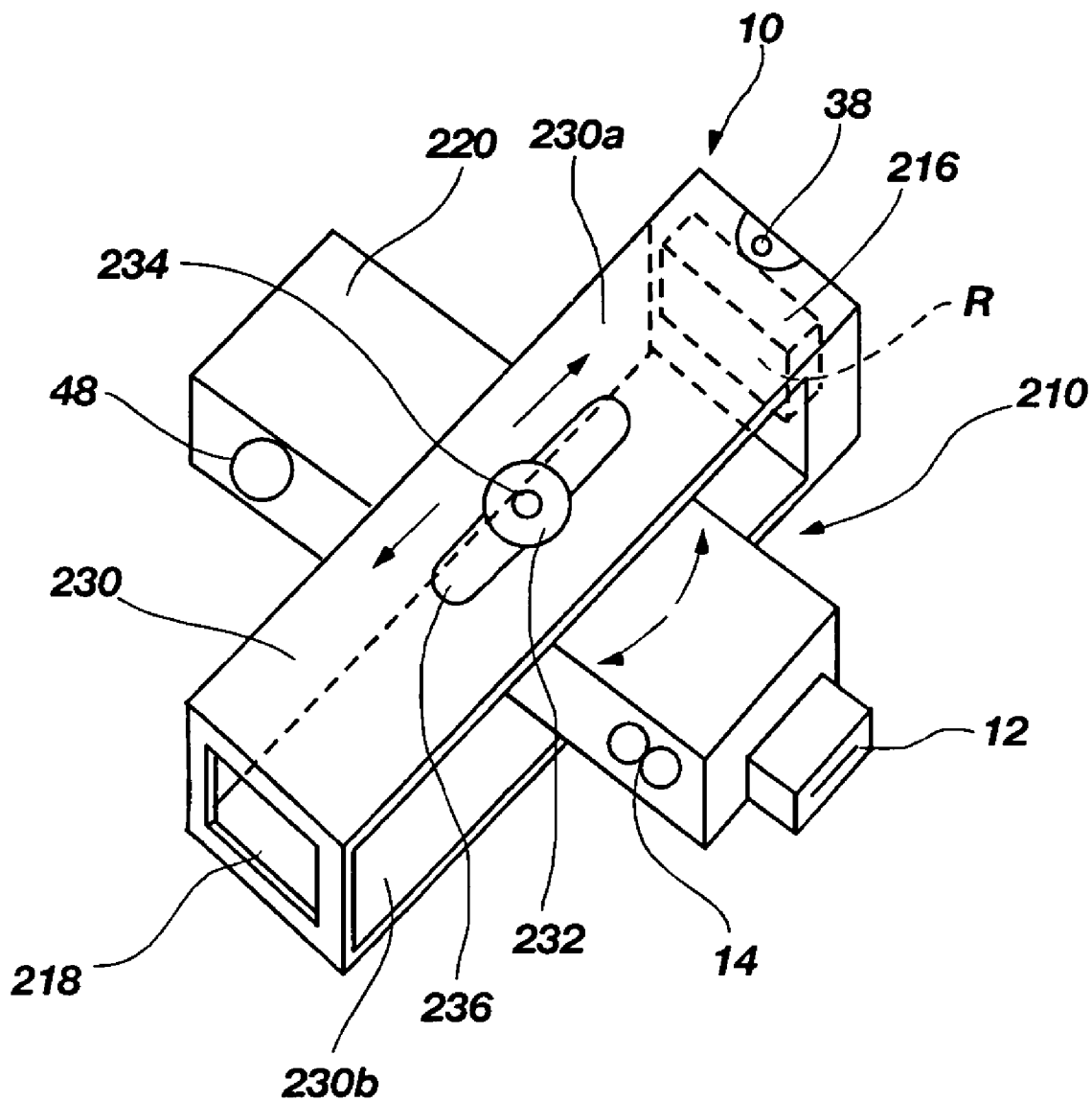
FIG. 4 depicts one embodiment of the invention including a cap and receiving orifice incorporated into the cover.
Figure 5A:
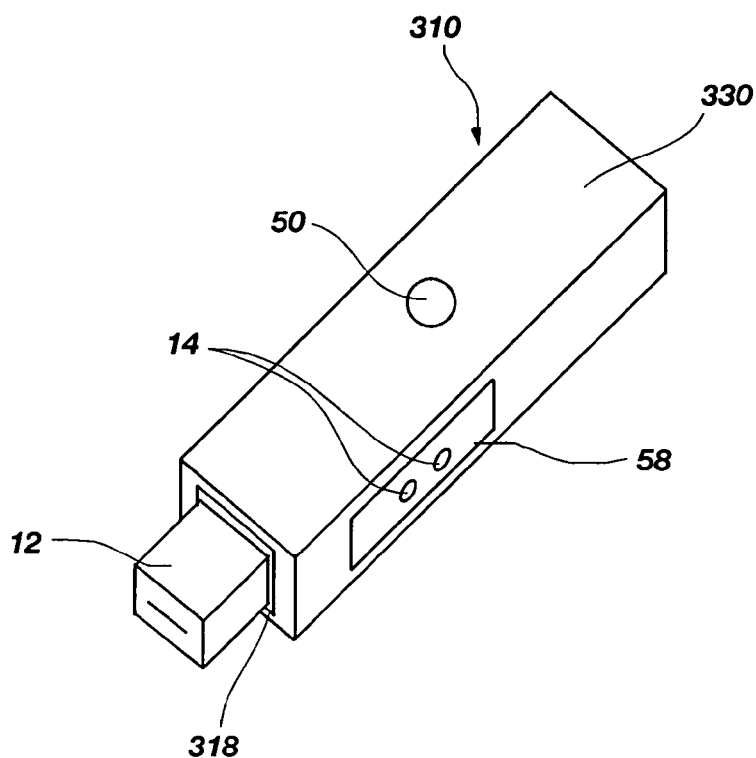
FIGS. 5A and 5B depict one embodiment of the invention including a button actuated linear extension of the terminal from the cover.
Figure 5B:
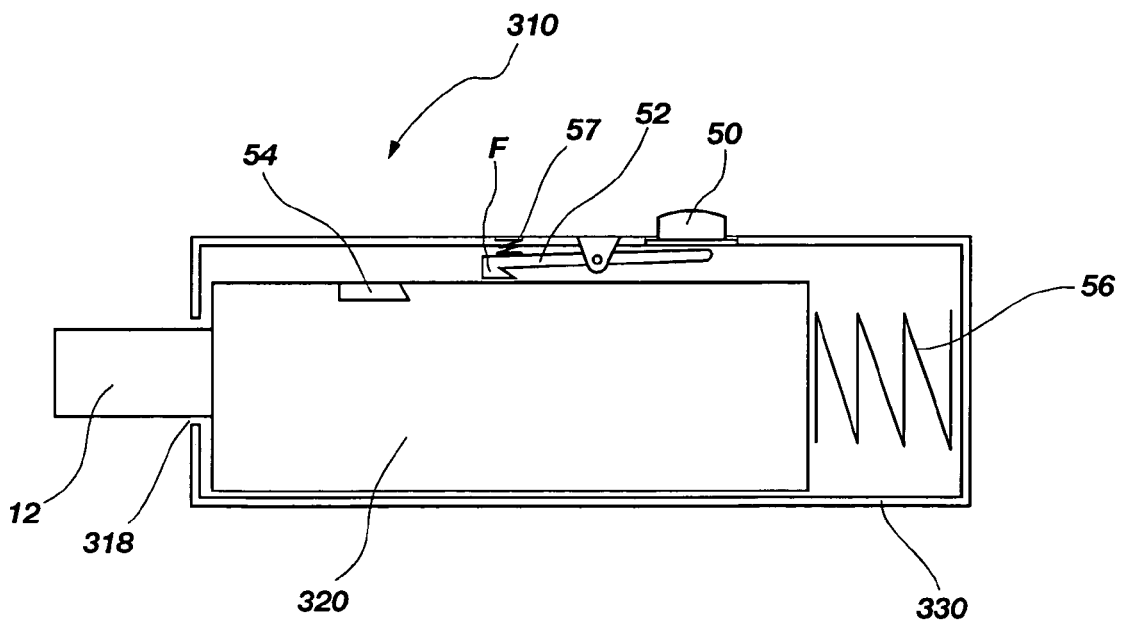

Another embodiment of storage device 210 is shown in FIG. 4, including a housing 220 having one or more semiconductor dice (not shown for clarity) disposed therein, and a terminal 12 protruding from one end thereof. In this embodiment, an open-sided cover 230 comprising extensions 230a and 230b joined at each end includes at least one elongate slot 236 of substantially constant width on at least one side thereof, cover 230 further including a cap 216 defining receptacle R in one end thereof, and a terminal exposure opening 218 through the other end. In this embodiment, at least one trunnion including a round trunnion shaft 234 with a diameter substantially equal to, but slightly less than, the width of the slot 236 protrudes from housing 220. Cap 216 may be engaged with the terminal 12 by positioning the cover 230 and device housing 220 in mutually parallel orientation and moving them longitudinally until terminal 12 is fully received within receptacle R of the cap 216. In order to provide a fully open position for storage device 210, longitudinal force is applied to pull housing 220 and cover 230 apart until terminal 12 is disengaged from cap 216 and trunnion cover 232 is approximately at the center of slot 236. In this position, the cover 230 may be rotated 180° and then again moved longitudinally toward housing 220 until terminal 12 extends through the terminal exposure opening 218. Operating indicators 14 are disposed on the sides of housing 220, allowing the user a clear view of at least one indicator 14 regardless of the orientation of the device 10 or cover 30 when terminal 12 is received within a host equipment port. A trunnion cover 232 may be employed to enhance retention of cover 230 on housing 220, particularly if only one trunnion/slot combination is employed.

Figure 7A:
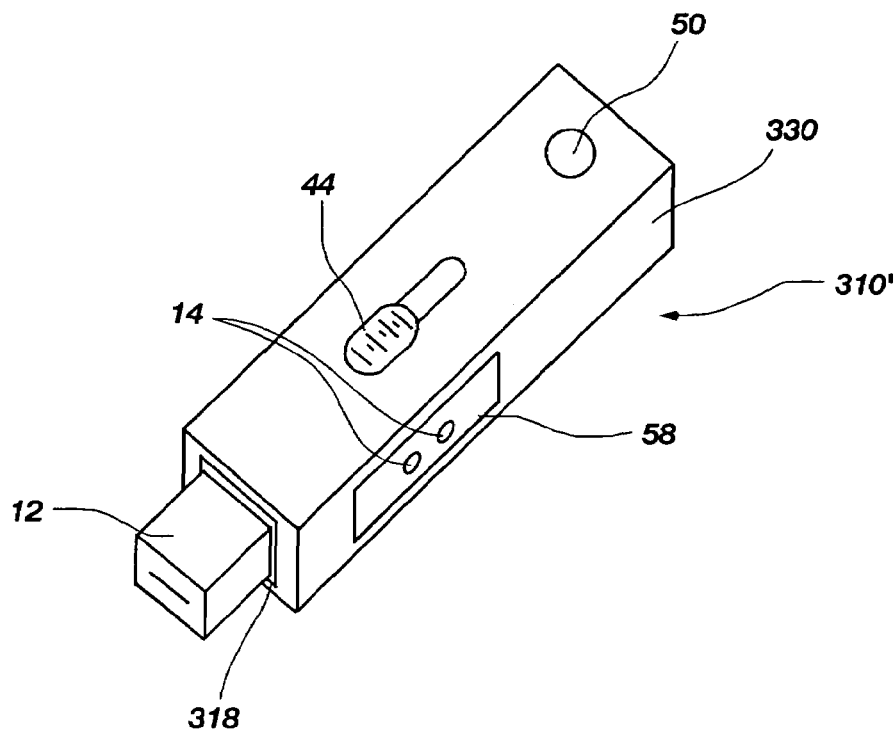
FIGS. 7A and 7B depict one embodiment of the invention including a button-actuated linear extension of the terminal from the cover with a thumb slide retraction element.
Figure 7B:
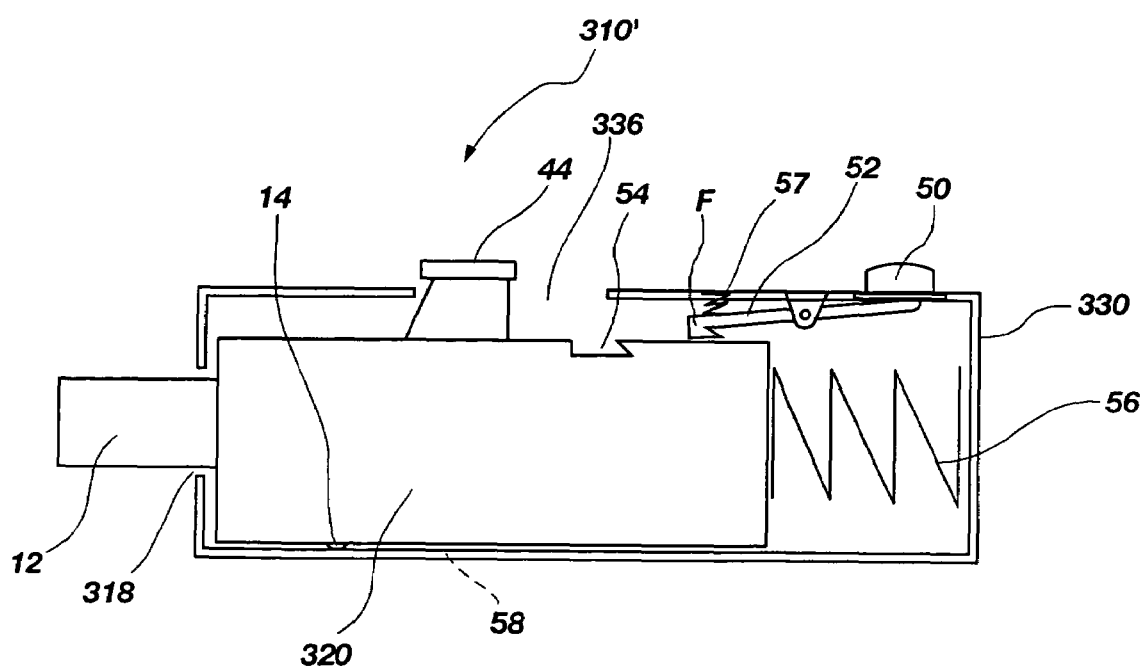

The embodiments of FIGS. 5A, 5B, 7A and 7B are drawn to similar storage devices 310 and 310' where device housing 320 is enclosed in cover 330 with terminal 12 automatically biased into an exposed, operating position through terminal exposure opening 318 when button 50 of a release mechanism is depressed. For the storage device 310 shown in FIGS. 5A and 5B, terminal 12 is manually longitudinally depressed against ejection spring 56 and into cover 330 where a foot F of pivotally mounted release mechanism 52 engages a housing lock recess 54 under the bias of spring 57. The storage device 310' shown in FIGS. 7A and 7B provides a thumb slide 44 protruding through a longitudinal slot 336 in cover 330, which may be used to retract the device housing 320 into cover 330 to encompass terminal 12. Operation indicators 14 may be included on the exterior of device housing 320 and may be viewed through the cover 330 via indicator windows 58 on each side of the device cover 30.

Figure 6A:
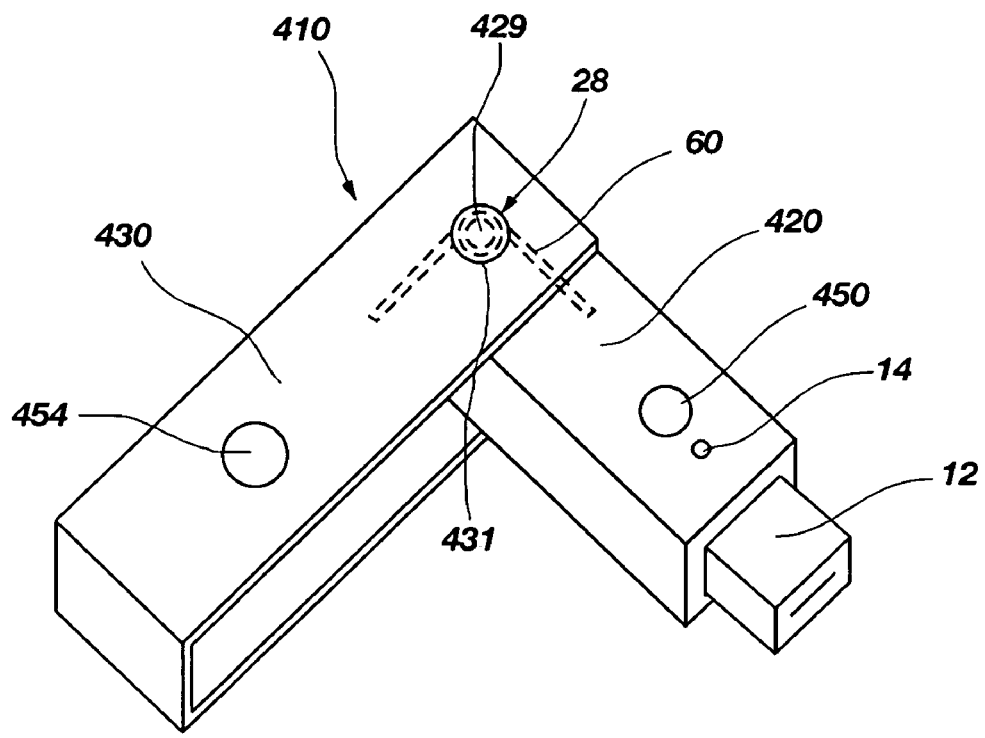
FIG. 6A depicts one embodiment of the invention including a button actuated rotation of the device body from the cover.
Figure 6B:
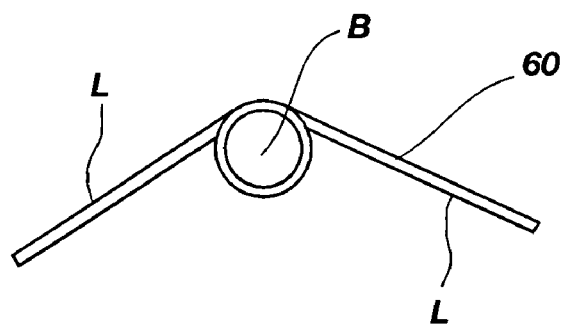
FIG. 6B depicts a spring used in the embodiment of FIG. 6A.

FIG. 6A depicts an embodiment of the storage device 410 where the device housing 420 is pivotally mounted to cover 430 by nubs 429 extending from opposing sides of housing 420 through holes 431 in cover 430, and automatically rotates out of cover 430 when spring-biased release button 450 on housing 420 is depressed through locking aperture 454. The device housing 420 is biased towards the open position by spring 60, shown in FIG. 6A, the bight B of which is disposed concentrically with nubs 429 and the legs L of which respectively engage housing 420 and cover 430. The user may rotate or "fold" the device housing 420 into cover 430 against the rotational opening bias provided by spring 60 until release button 450 engages locking aperture 454.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. An electronic device assembly, comprising:
 a housing comprising at least one memory element disposed therein and operably coupled to a terminal protruding from an exterior thereof;
 a circular groove in a surface of one side of the housing and including at least one locking segment therein extending deeper into the one side substantially perpendicular to the surface of the one side than a remaining portion of the circular groove and a pivot recess on a surface of an opposing side of the housing, concentrically located with the circular groove; and
 a cover including one extension disposed over the one side of the housing and including at least one locking protrusion engaged with the circular groove, the one extension joined proximate one end thereof to another extension disposed over the opposing side of the housing and including a pivot protrusion engaged with the pivot recess.

2. The electronic device assembly of claim 1, wherein the at least one locking segment comprises two diametrically opposed locking segments.

3. The electronic device assembly of claim 1, wherein the at least one locking protrusion comprises two locking protrusions located so as to be diametrically opposingly received in the circular groove.

4. The electronic device assembly of claim 1, further including a key ring or lanyard hole through the cover proximate a location of joinder of the two sides thereof.

5. The electronic device assembly of claim 1, wherein the housing includes at least one ergonomic feature on an exterior surface thereof to facilitate gripping thereof by a user.

6. The electronic device assembly of claim 5, wherein the at least one ergonomic feature includes at least one of knobs, ridges or treads.

7. The electronic device assembly of claim 6, wherein the at least one ergonomic feature comprises at least one of an elastomeric material, a thermoplastic, a plastic or a polyamide.

8. The electronic device assembly of claim 1, further comprising a plurality of indicator lights disposed on an exterior surface thereof in a configuration wherein at least one indicator light is visible when the terminal is operably received in a port of another electronic device.

9. The electronic device assembly of claim 8, wherein at least one of the plurality of indicator lights is located on an exterior surface of the housing intermediate the sides thereof.

10. An electronic device assembly, comprising:
 a housing having at least one memory element disposed therein and operably coupled to a terminal protruding from an exterior thereof;
 concentric nubs protruding from opposing sides of the housing and at least one recess in one of the sides of the housing offset from the nubs; and
 a cover including extensions joined proximate one end thereof and respectively disposed over the opposing sides of the housing, the extensions including concentric holes therein receiving the nubs, one extension further including at least one locking protrusion on an interior surface thereof offset from the holes at substantially the same distance as the at least one recess offset and adjacent the side of the housing bearing the at least one recess.

11. The electronic device assembly of claim 10, further including a key ring or lanyard hole through the cover proximate a location of joinder of the two sides thereof.

12. The electronic device assembly of claim 10, wherein the housing includes at least one ergonomic feature on an exterior surface thereof to facilitate gripping thereof by a user.

13. The electronic device assembly of claim 12, wherein the at least one ergonomic feature includes at least one of one of knobs, ridges or treads.

14. The electronic device assembly of claim 13, wherein the at least one ergonomic feature comprises at least one of an elastomeric material, a thermoplastic, a plastic or a polyamide.

15. The electronic device assembly of claim 10, further comprising a plurality of indicator lights disposed on an exterior surface thereof in a configuration wherein at least one indicator light is visible when the terminal is operably received in a port of another electronic device.

16. The electronic device assembly of claim 15, wherein at least one of the plurality of indicator lights is located on an exterior surface of the housing intermediate the sides thereof.

17. The electronic device assembly of claim 10, further including a circular groove on one side of the housing con centric with the nubs, and wherein the at least one recess comprises at least one deeper locking segment in the circular groove.

18. The electronic device assembly of claim 17, wherein the at least one deeper locking segment comprises two diametrically opposed deeper locking segments.

19. The electronic device assembly of claim 18, wherein the at least one locking protrusion comprises two locking protrusions located so as to be diametrically opposingly received in the circular groove.

* * * * *

UNITED STATES PATENT AND TRADEMARK OFFICE
CERTIFICATE OF CORRECTION

| | | |
|---|---|---|
| PATENT NO. | : 7,500,858 B2 | |
| APPLICATION NO. | : 11/494432 | |
| DATED | : March 10, 2009 | |
| INVENTOR(S) | : Emerson et al. | |

It is certified that error appears in the above-identified patent and that said Letters Patent is hereby corrected as shown below:

In column 8, lines 51-52, in Claim 13, delete "one of one of" and insert -- one of --, therefor.

Signed and Sealed this

Twenty-third Day of June, 2009

JOHN DOLL
*Acting Director of the United States Patent and Trademark Office*